US012693307B2

(12) United States Patent
Takizawa et al.

(10) Patent No.: US 12,693,307 B2
(45) Date of Patent: Jul. 28, 2026

(54) INERTIAL SENSOR, METHOD OF MANUFACTURING INERTIAL SENSOR, AND INERTIAL MEASUREMENT UNIT

(71) Applicant: SEIKO EPSON CORPORATION, Tokyo (JP)

(72) Inventors: Teruo Takizawa, Matsumoto (JP); Kazunori Ueno, Tsuruoka (JP); Taiki Goto, Tsuruoka (JP)

(73) Assignee: SEIKO EPSON CORPORATION, Tokyo (JP)

( * ) Notice: Subject to any disclaimer, the term of this patent is extended or adjusted under 35 U.S.C. 154(b) by 392 days.

(21) Appl. No.: 18/343,094

(22) Filed: Jun. 28, 2023

(65) Prior Publication Data

US 2024/0003933 A1 Jan. 4, 2024

(30) Foreign Application Priority Data

Jun. 30, 2022 (JP) ................................. 2022-105586

(51) Int. Cl.
*G01P 15/08* (2006.01)
*H10P 14/60* (2026.01)
(Continued)

(52) U.S. Cl.
CPC ...... *G01P 15/0802* (2013.01); *H10P 14/6519* (2026.01); *H10P 14/69215* (2026.01);
(Continued)

(58) Field of Classification Search
CPC ......... G01P 15/0802; G01P 2015/0814; G01P 2015/0871; G01P 15/125; H01L 21/02164; H01L 21/02323; H01L 21/31051; H01L 21/67138; H01L 21/76262; H01L 21/76831; G01C 21/16; H10P 14/6519; H10P 14/69215; H10P 72/0444;
(Continued)

(56) References Cited

U.S. PATENT DOCUMENTS 6,130,119 A * 10/2000 Jinnai ............... H01L 21/02211
                                                  257/E29.283
6,180,957 B1 * 1/2001 Miyasaka .............. H10D 86/60
                                                  257/353
(Continued)

FOREIGN PATENT DOCUMENTS

JP      11-248733 A      9/1999
JP      2003-45988 A     2/2003

*Primary Examiner* — Dale E Page
*Assistant Examiner* — Quovaunda Jefferson
(74) *Attorney, Agent, or Firm* — Rankin, Hill & Clark LLP

(57) ABSTRACT

An inertial sensor includes: a substrate; an insulating film provided on a main surface of the substrate; a first semiconductor layer and a second semiconductor layer which are provided on an opposite-side surface of the insulating film from the substrate; a first oxide film provided on a first side surface of the first semiconductor layer on a second semiconductor layer side; a second oxide film provided on a second side surface of the second semiconductor layer on a first semiconductor layer side; a planarization insulating film provided above the first oxide film and the second oxide film and between the first oxide film and the second oxide film; and a wiring provided on the planarization insulating film and electrically coupled to the second semiconductor layer.

6 Claims, 13 Drawing Sheets

(51) Int. Cl.

| | |
|---|---|
| *H10P 14/692* | (2026.01) |
| *H10P 72/00* | (2026.01) |
| *H10P 90/00* | (2026.01) |
| *H10P 95/00* | (2026.01) |
| *H10W 10/10* | (2026.01) |
| *H10W 20/00* | (2026.01) |

(52) U.S. Cl.
CPC ...... *H10P 72/0444* (2026.01); *H10P 90/1912* (2026.01); *H10P 95/06* (2026.01); *H10W 10/181* (2026.01); *H10W 20/076* (2026.01)

(58) Field of Classification Search
CPC .. H10P 90/1912; H10P 95/06; H10W 10/181; H10W 20/076
See application file for complete search history.

(56) References Cited

U.S. PATENT DOCUMENTS

| | | | | |
|---|---|---|---|---|
| 6,306,694 B1 * | 10/2001 | Yamazaki | .......... | H10D 86/0221 |
| | | | | 257/E29.279 |
| 8,252,647 B2 * | 8/2012 | Lee | .................... | H10D 30/0293 |
| | | | | 438/270 |

* cited by examiner

FIG. 7

INERTIAL SENSOR, METHOD OF MANUFACTURING INERTIAL SENSOR, AND INERTIAL MEASUREMENT UNIT

The present application is based on, and claims priority from JP Application Serial Number 2022-105586, filed Jun. 30, 2022, the disclosure of which is hereby incorporated by reference herein in its entirety.

BACKGROUND

1. Technical Field

The present disclosure relates to an inertial sensor, a method of manufacturing an inertial sensor, and an inertial measurement unit.

2. Related Art

JP-A-11-248733 discloses an angular velocity sensor in which an insulator-filled trench groove is formed in a silicon substrate which is a semiconductor substrate, and, a fixed electrode and an outer peripheral portion at a base portion thereof are electrically separated, for example, by an insulator by which the insulator-filled trench groove is filled. JP-A-2003-45988 discloses a semiconductor device in which an insulation separation trench is formed in a silicon substrate, a side wall insulating film is formed on a side wall of the insulation separation trench, and embedded polysilicon as a conductive material is filled in the insulation separation trench on which the side wall insulating film is formed.

However, when the technique disclosed in JP-A-2003-45988 is applied to the angular velocity sensor disclosed in JP-A-11-248733, the conductive material is inserted between the fixed electrode and the outer peripheral portion at the base portion of the fixed electrode, that is, between semiconductors separated by the trench. Therefore, there is concern that parasitic capacitance between the semiconductors separated by the trench increases, and bias characteristics or the like of the angular velocity sensor deteriorates.

For example, when the trench is filled with a thermal oxide film, irregularities remain on a surface of the thermal oxide film, and a crack may occur in a wiring when the wiring is formed in an upper layer of the trench.

That is, an inertial sensor having high reliability, a method of manufacturing an inertial sensor, and an inertial measurement unit are required.

SUMMARY

An inertial sensor according to an aspect of the present application includes: a substrate; an insulating film provided on a main surface of the substrate; a first semiconductor layer and a second semiconductor layer which are provided on an opposite-side surface of the insulating film from the substrate; a first oxide film provided on a first side surface of the first semiconductor layer on a second semiconductor layer side; a second oxide film provided on a second side surface of the second semiconductor layer on a first semiconductor layer side; a planarization insulating film provided above the first oxide film and the second oxide film and between the first oxide film and the second oxide film; and a wiring provided on the planarization insulating film and electrically coupled to the second semiconductor layer.

A method of manufacturing an inertial sensor according to an aspect of the present application includes: preparing a base body including a substrate, an insulating film formed on a main surface of the substrate, and a semiconductor layer formed on an opposite-side surface of the insulating film from the substrate; removing a part of the semiconductor layer to form a trench portion and a first semiconductor layer and a second semiconductor layer, the first semiconductor layer and the second semiconductor layer facing each other with the trench portion interposed therebetween; thermally oxidizing the first semiconductor layer and the second semiconductor layer to form a first oxide film and a second oxide film, and physically bringing the first oxide film and the second oxide film into contact to fill the trench portion; forming a planarization insulating film on the first oxide film and the second oxide film by a coating method; and forming a wiring on the planarization insulating film.

An inertial measurement unit according to an aspect of the present application includes: the above-described inertial sensor; and a control unit configured to control the inertial sensor.

BRIEF DESCRIPTION OF THE DRAWINGS

FIG. 7 is a cross-sectional view of a form of the insulating separation portion in the manufacturing process.

DESCRIPTION OF EXEMPLARY EMBODIMENTS

First Embodiment

Outline of Acceleration Sensor

Figure 1:
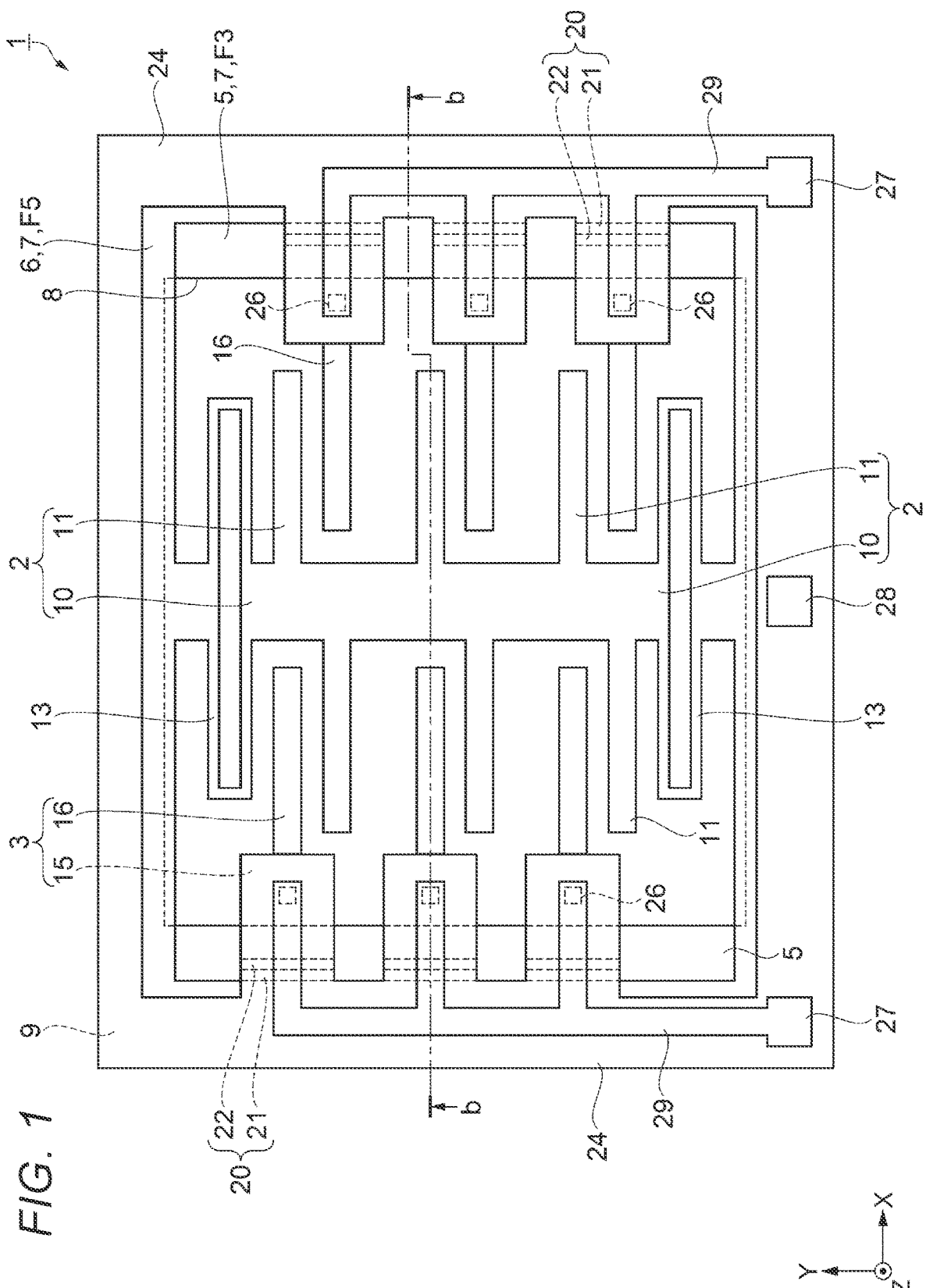
FIG. 1 is a plan view of an acceleration sensor according to a first embodiment.
Figure 2:
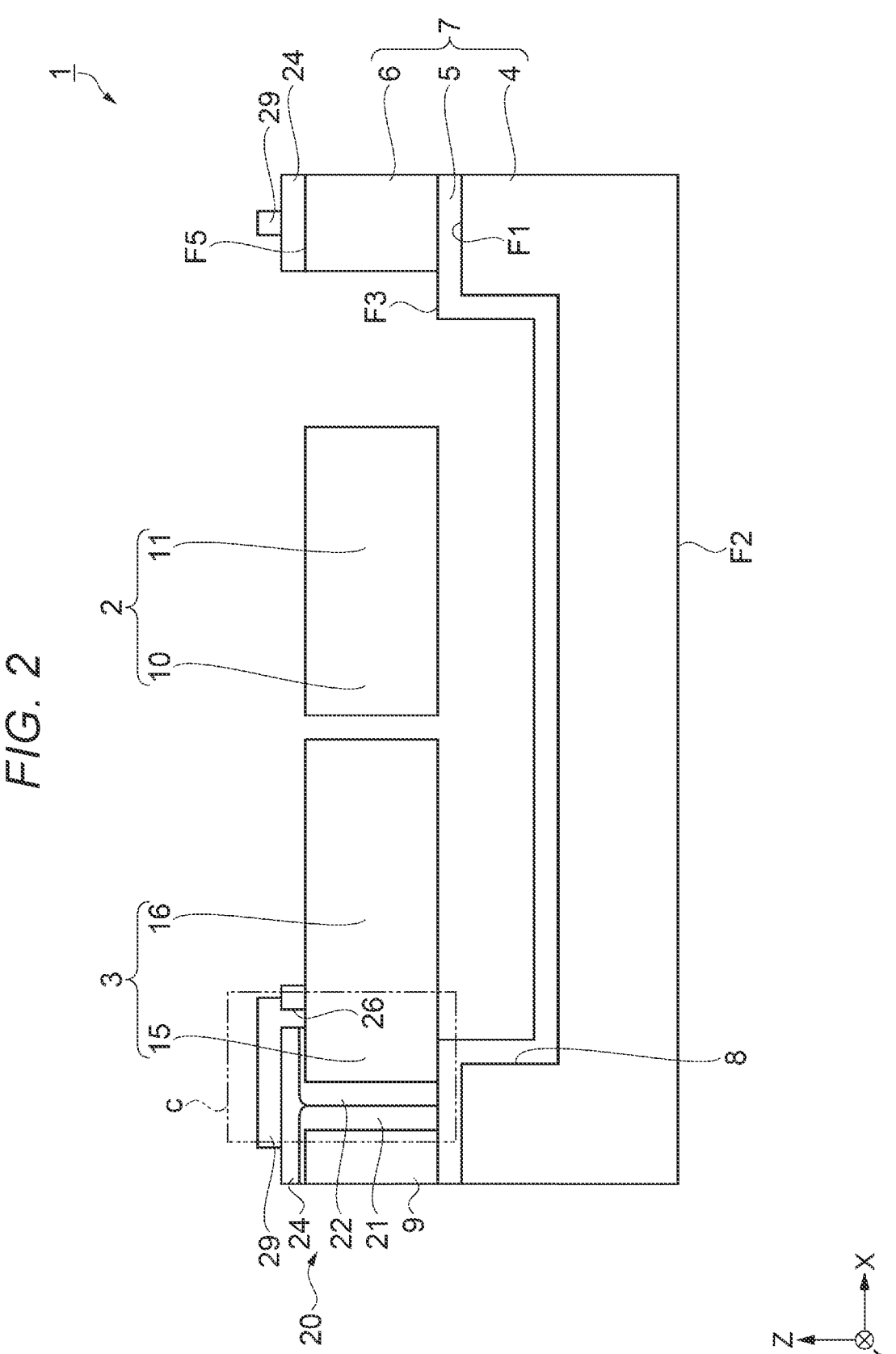
FIG. 2 is a cross-sectional view taken along a line b-b in FIG. 1.

FIG. 1 is a plan view of an acceleration sensor according to a first embodiment. FIG. 2 is a cross-sectional view taken along a line b-b in FIG. 1.

First, an acceleration sensor 1 as an example of an inertial sensor according to the embodiment will be described with reference to the drawings. In the following drawings, an X axis, a Y axis, and a Z axis are shown as three axes orthogonal to one another. A direction along the X axis is referred to as an "X direction". A direction along the Y axis is referred to as a "Y direction". A direction along the Z axis is referred to as a "Z direction". An arrow tip side in each axial direction is also referred to as a "plus side". An arrow proximal end side is also referred to as a "minus side". That is, for example, the Y direction refers to both a plus side in the Y direction and a minus side in the Y direction. A plus side in the Z direction is also referred to as "upper". A minus side in the Z direction is also referred to as "lower". In addition, in the following drawings, in order to make the description easy to understand, dimensions or scales may be described to be different from actual ones.

The acceleration sensor 1 is a static capacitance type acceleration sensor that detects an acceleration using a variation in static capacitance that depends on a distance between a movable portion 2 and a fixed electrode portion 3.

As shown in FIGS. 1 and 2, the acceleration sensor 1 includes a base body 7 on which a substrate 4, an insulating film 5, and a semiconductor layer 6 are stacked in this order along the Z direction.

The substrate 4 has a first surface F1 which is a main surface of the substrate 4, and a second surface F2 which is in a front and back relationship with the first surface F1. In the embodiment, the first surface F1 is a surface on a plus side in the Z direction of the substrate 4, and is also referred to as an upper surface of the substrate 4. The second surface F2 is a surface on a minus side in the Z direction of the substrate 4, and is also referred to as a lower surface of the substrate 4. In a plan view in the Z direction, a bottomed recess 8 is formed in a central portion of the substrate 4. The recess 8 has an opening in the first surface F1 of the substrate 4, and is recessed from the first surface F1 toward the second surface F2. The recess 8 is also referred to as a cavity. In the embodiment, the substrate 4 is a semiconductor substrate, specifically, a single-crystal silicon substrate.

The insulating film 5 is formed on the first surface F1 which is the upper surface of the substrate 4. In the embodiment, the insulating film 5 is made of silicon oxide. In the embodiment, the insulating film 5 is also formed on a side surface and a bottom surface of the recess 8. In the embodiment, the insulating film 5 may be formed on the first surface F1, and the insulating film 5 on the side surface and the bottom surface of the recess 8 may be removed. In the embodiment, no insulating film is formed on the second surface F2 which is the lower surface of the substrate 4, but the insulating film may be formed on the second surface F2.

The semiconductor layer 6 is formed on an opposite side of the substrate 4 with the insulating film 5 interposed therebetween. The semiconductor layer 6 is bonded to a third surface F3, which is an opposite-side surface of the insulating film 5 from the substrate 4, in a peripheral portion of the recess 8. The third surface F3 of the insulating film 5 is also referred to as an upper surface of the insulating film 5.

The semiconductor layer 6 has a fourth surface F5 which is an opposite-side surface from the insulating film 5. The fourth surface F5 of the semiconductor layer 6 is also referred to as an upper surface of the semiconductor layer 6. The semiconductor layer 6 is made of a semiconductor such as silicon, germanium, or silicon germanium. The semiconductor layer 6 is preferably made of a single-crystal semiconductor doped with impurities such as boron (B) or phosphorus (P). By doping the impurities, carriers are generated in the semiconductor layer 6, and a resistivity can be reduced. In the embodiment, the semiconductor layer 6 is made of single-crystal silicon having a resistivity of 0.001 $\Omega$cm to 100 $\Omega$cm by doping boron. Further, in the embodiment, the base body 7 is a silicon on insulator (SOI) substrate having the recess 8 which is a cavity.

The movable portion 2, the fixed electrode portions 3, an outer frame portion 9, and elastic portions 13 are formed at the semiconductor layer 6. In the embodiment, the movable portion 2 is formed inside the cavity recess 8 in a plan view in the Z direction. A plurality of fixed electrode portions 3 are formed on both sides of the movable portion 2 in the X direction with the movable portion 2 interposed therebetween.

The outer frame portion 9 is a substantially rectangular frame body surrounding the movable portion 2 and the fixed electrode portions 3. The outer frame portion 9 is formed on the third surface F3 which is the upper surface of the insulating film 5 in the peripheral portion of the cavity recess 8. The movable portion 2 and the outer frame portion 9 are coupled through the elastic portions 13.

The movable portion 2 includes a movable electrode support portion 10 and a plurality of movable electrode fingers 11 supported by the movable electrode support portion 10. In the embodiment, the movable portion 2 is a vibrator displaceable in the Y direction.

The movable electrode support portion 10 has a rectangular shape with a long side in the Y direction. The elastic portions 13 are formed at both ends of the movable electrode support portion 10 in the Y direction. The movable electrode fingers 11 are formed on both side surfaces of the movable electrode support portion 10 in the X direction. The movable electrode fingers 11 each have a cantilever shape in which a free end extends from the movable electrode support portion 10 toward the fixed electrode portion 3.

The fixed electrode portion 3 includes fixed electrode support portions 15 and fixed electrode fingers 16.

The fixed electrode support portions 15 are formed on the third surface F3, which is the upper surface of the insulating film 5, in the peripheral portion of the cavity recess 8. The fixed electrode fingers 16 each have a cantilever shape in which a free end extends from the fixed electrode support portion 15 toward the movable portion 2.

The movable electrode finger 11 extending to the plus side in the X direction and the fixed electrode finger 16 extending to the minus side in the X direction are disposed to face each other at an interval. Similarly, the movable electrode finger 11 extending to the minus side in the X direction and the fixed electrode finger 16 extending to the plus side in the X direction are disposed to face each other at the interval. In a state in which the movable portion 2 is stationary, a side surface of the movable electrode finger 11 and a side surface of the fixed electrode finger 16 are at a predetermined interval. An electrode pad 27 is provided at one corner in a Y minus direction of the outer frame portion 9. A wiring 29 extends from the electrode pad 27 in a Y plus direction. The extended wiring 29 branches in a direction of the fixed electrode support portions 15 (X plus direction) and is coupled to contact portions 26.

As shown in FIG. 2, the contact portion 26 is electrically coupled to the fixed electrode support portion via a planarization insulating film 24. In other words, the electrode pad 27 is electrically coupled to the fixed electrode support portions 15 via the wiring 29 and the contact portions 26. The electrode pad 27 is also provided at the other corner in the Y minus direction of the outer frame portion 9. Similarly, the electrode pad 27 is electrically coupled to the fixed electrode support portions via the wiring 29 and the contact portions 26.

The outer frame portion 9 is, for example, electrically grounded by a wiring (not shown), and a potential difference is generated between the outer frame portion 9 and the fixed electrode support portions 15.

Therefore, as shown in FIG. 2, an insulating separation portion 20 for insulating the outer frame portion 9 and the fixed electrode support portions 15 is provided therebetween. Further, as described above, in the related art, there is a concern that a crack occurs in the wiring 29 on the upper surface due to influence of irregularities generated on a surface of the insulating separation portion 20. In the insulating separation portion 20 according to the embodiment, the concern is eliminated. Details of the insulating separation portion 20 will be described later.

Such an acceleration sensor 1 can detect the acceleration as follows. In the embodiment, the acceleration sensor 1 detects an acceleration in the Y direction.

When the acceleration in the Y direction is applied, the movable portion 2 is displaced in the Y direction with respect to the base body 7. Therefore, the static capacitance between the movable electrode fingers 11 of the movable portion 2 and the fixed electrode fingers 16 of the fixed electrode portion 3 changes. The acceleration in the Y direction can be detected based on the change in the static capacitance. The acceleration detection is not limited to the acceleration in the Y direction, and an acceleration in any direction can be detected. For example, an acceleration in the X direction can be detected by rotating the acceleration sensor 1 by 90 degrees in a plane.

Configuration of Insulating Separation Portion

Figure 3:
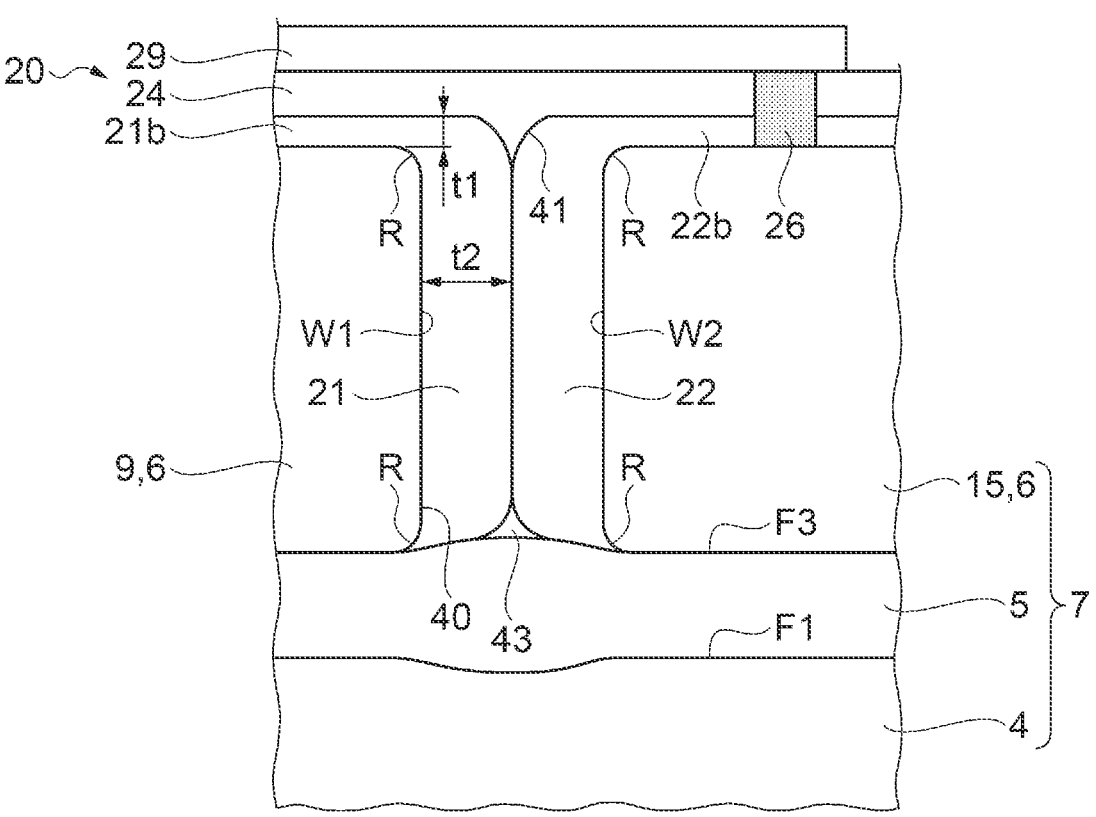
FIG. 3 is an enlarged cross-sectional view of a portion c shown in FIG. 2.

FIG. 3 is an enlarged cross-sectional view of a portion c shown in FIG. 2.

As shown in FIG. 3, a trench portion 40 is formed in the semiconductor layer 6. The trench portion 40 is a bottomed groove having the insulating film 5 as a bottom. The semiconductor layer 6 is divided, by the trench portion into the outer frame portion 9 as a first semiconductor layer and the fixed electrode support portion 15 as a second semiconductor layer. The insulating separation portion 20 includes a first oxide film 21, a second oxide film 22, and the planarization insulating film 24.

The first oxide film 21 and the second oxide film 22 are thermal oxide films filling the trench portion 40. The first oxide film 21 is provided along a first side surface W1 on an outer frame portion 9 side of the trench portion 40 with the insulating film 5 as a bottom, and also extends on an upper surface of the outer frame portion 9. The oxide film extending on the upper surface of the outer frame portion 9 is referred to as a first oxide film 21b. As will be described in detail later, a thickness t1 of the first oxide film 21b is smaller than a thickness t2 of the first oxide film 21.

The second oxide film 22 is provided along a second side surface W2 on a fixed electrode support portion side of the trench portion 40 with the insulating film 5 as a bottom, and also extends on an upper surface of the fixed electrode support portion 15. The oxide film extending on the upper surface of the fixed electrode support portion 15 is referred to as a second oxide film 22b. Similar to the first oxide film 21 side, the thickness t1 of the second oxide film 22b is smaller than the thickness t2 of the second oxide film 22. In other words, the first oxide film 21 and the second oxide film 22 are made of thermal silicon oxide.

In the trench portion 40, the first oxide film 21 and the second oxide film 22 are in physical contact with each other. A gap 43 is formed in a portion where the first oxide film 21 and the second oxide film 22 are bonded to the insulating film 5. The gap 43 is formed in a portion surrounded by the insulating film 5, the first oxide film 21, and the second oxide film 22. When the gap portion 43 is present, a dielectric constant of the gap 43 is a dielectric constant ε0 of the vacuum. The dielectric constant ε0 of the vacuum is $8.85 \times 10^{-12}$ F/m. In general, since a relative dielectric constant of an oxide film with respect to the dielectric constant ε0 of the vacuum is 3.8 to 3.9, fringe capacitance is reduced due to the presence of the gap 43 having a relative dielectric constant of 1. That is, parasitic capacitance between the first semiconductor layer and the second semiconductor layer can be reduced.

A film thickness of the insulating film 5 immediately below the gap 43 is larger than a film thickness of a portion surrounding that immediately below the gap 43. The reason why this portion of the insulating film 5 is thicker is that, during oxidization in a thermal oxidation treatment, a thermal oxide film is formed when oxygen atoms enter and diffuse into the insulating film 5 and react with the substrate 4. Since the insulating film 5 in this portion is thick, the parasitic capacitance between the first semiconductor layer and the second semiconductor layer can be reduced.

Further, corners R are formed at upper and lower corner portions of the outer frame portion 9. Similarly, corners R are formed at upper and lower corner portions of the fixed electrode support portion 15. In other words, the corners R are formed in upper peripheral edge portions and lower peripheral edge portions of the trench portion 40. These corners R are formed by performing the thermal oxidation treatment for a sufficient time, and thus symmetry of the parasitic capacitance such as the fringe capacitance is better.

A recess 41 is formed in a boundary portion between the upper surfaces of the first oxide film 21 and the second oxide film 22. As in the case where the corners R are formed at the corner portions of the outer frame portion 9 and the fixed electrode support portion 15, the boundary portion between the upper surfaces of the first oxide film 21 and the second oxide film 22 also have curved lines. An interval gradually narrows from the upper surfaces of the first oxide film 21 and the second oxide film 22 to the region in physical contact. The recess 41 can be expressed as a V-groove, a seam, a notch, or the like in another view. The recess 41 having such a depth is filled with the upper planarization insulating film 24. That is, the planarization insulating film 24 is uniformly present at the boundary portion between the first oxide film 21 and the second oxide film 22, and no gap is present. In other words, the planarization insulating film 24 is provided above the first oxide film 21 and the second oxide film 22 and between the first oxide film 21 and the second oxide film 22.

The planarization insulating film 24 is a low dielectric constant layer in a preferred example. The low dielectric constant layer is an insulating layer made of a material having a relative dielectric constant of 3.9 or less of a thermal oxide film, and a spin-on-glass (SOG) material is preferably used. The SOG material is a low dielectric constant material that can be applied to form a film by a spin coating method using a SOG solution containing siloxane as a main component. For example, silica glass, an alkylsiloxane polymer, an alkylsilsesquioxane polymer, a hydrogenated silsesquioxane polymer, or a hydrogenated alkylsilsesquioxane polymer can be used. An upper surface of the planarization insulating film 24 is planarized.

The wiring 29 is formed on the upper surface of the planarization insulating film 24. The wiring 29 is made of a metal multilayer film as a preferred example. In other words, the wiring 29 is provided on the planarization insulating film 24 and is electrically coupled to the fixed electrode support portions 15. The metal multilayer film is preferably made of a material capable of ensuring adhesion to the planarization insulating film 24. For example, a metal multilayer film mainly containing titanium nitride, aluminum, or copper is used. The electrode pads 27 and an electrode pad 28 (FIG. 1) are also made of the same material.

The contact portion 26 that electrically couples the wiring 29 and the fixed electrode support portion 15 is provided therebetween. The contact portion 26 penetrates the second oxide film 22b on the upper surface of the fixed electrode support portion 15 and the planarization insulating film 24 to couple the wiring 29 and the fixed electrode support portion 15. The contact portion 26 is a via hole and is made of a conductive material containing a metal such as aluminum, copper, or tungsten.

Method of Manufacturing Acceleration Sensor

Figure 4:
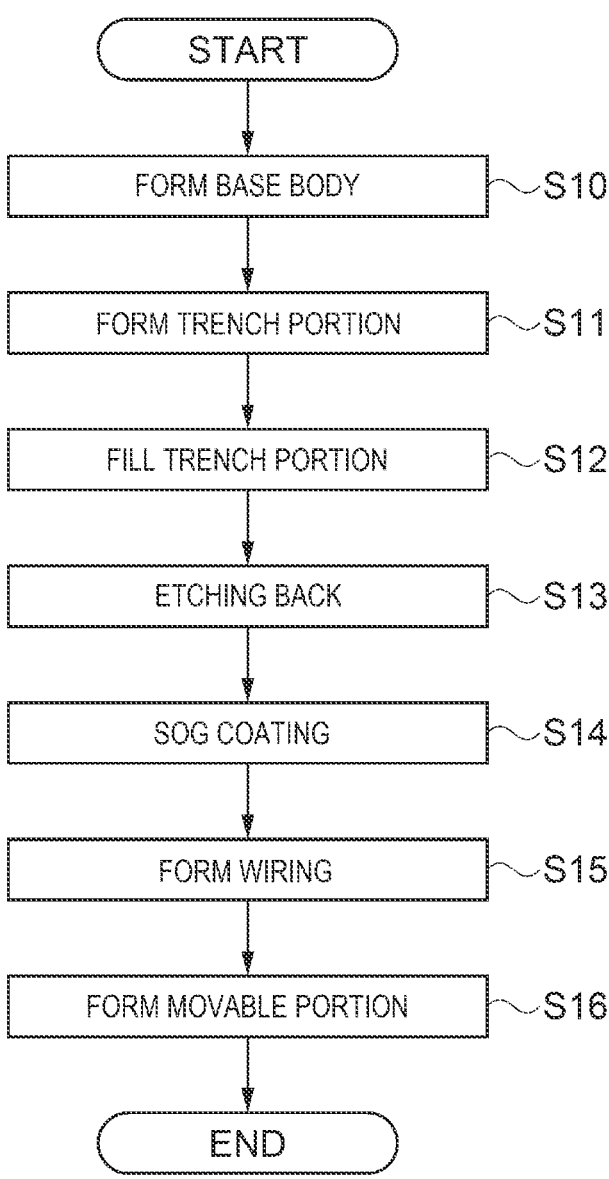
FIG. 4 is a flowchart showing a method of manufacturing the acceleration sensor.

FIG. 4 is a flowchart showing a method of manufacturing the acceleration sensor. FIGS. 5 to 8 are cross-sectional views of the insulating separation portion in a manufacturing process, and correspond to FIG. 3.

Here, a method of manufacturing the acceleration sensor 1 will be described mainly focusing on the insulating separation portion 20.

In step S10, the base body 7 (FIG. 1) is prepared. As described above, the base body 7 is an SOI substrate including the semiconductor layer 6 and the recess 8 which is a cavity. In other words, in this step, the base body 7 including the substrate 4, the insulating film 5 provided on the first surface F1 which is the main surface of the substrate 4, and the semiconductor layer 6 formed on an opposite-side surface of the insulating film 5 from the substrate 4 is prepared.

In step S11, the trench portion 40 is formed in the semiconductor layer 6. Specifically, as shown in FIG. a hard mask 48 in which a portion to be the trench portion is opened is formed, and the trench portion 40 is formed using a deep reactive ion etching (DRIE) method.

Figure 5:
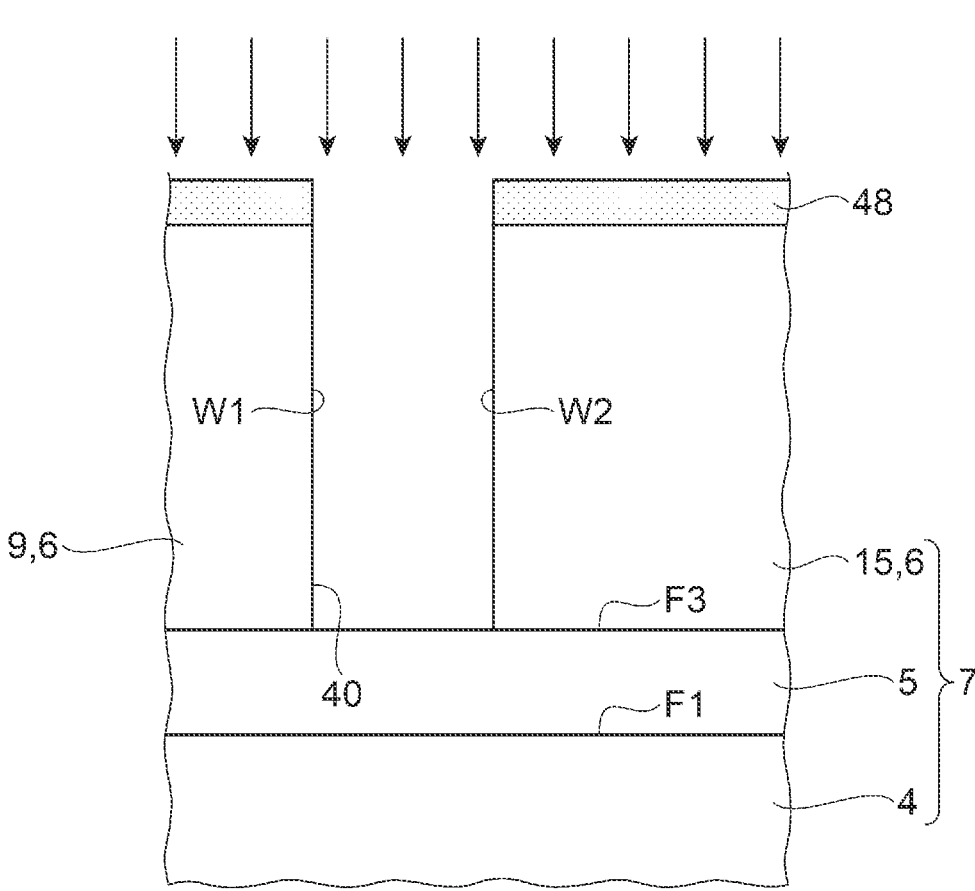
FIG. 5 is a cross-sectional view of a form of an insulating separation portion in a manufacturing process.

Accordingly, as shown in FIG. 5, the trench portion 40 is formed to divide the semiconductor layer 6 into two parts with the insulating film 5 as the bottom. In a preferred example, the hard mask 48 is a mask obtained by forming a thermal oxide film on a surface of the semiconductor layer 6 and patterning the thermal oxide film. Alternatively, a mask obtained by forming a chemical vapor deposition (CVD) film and patterning the CVD film may be used. A size of the trench portion 40 is, for example, about 2 μm in width×30 μm in depth. In other words, in this step, by removing a part of the semiconductor layer 6, the trench portion 40, and the outer frame portion 9 as the first semiconductor layer and the fixed electrode support portion 15 as the second semiconductor layer facing each other with the trench portion 40 interposed therebetween are formed. The trench portion 40 is formed in a portion where the cavity recess 8 is not present.

Figure 6:
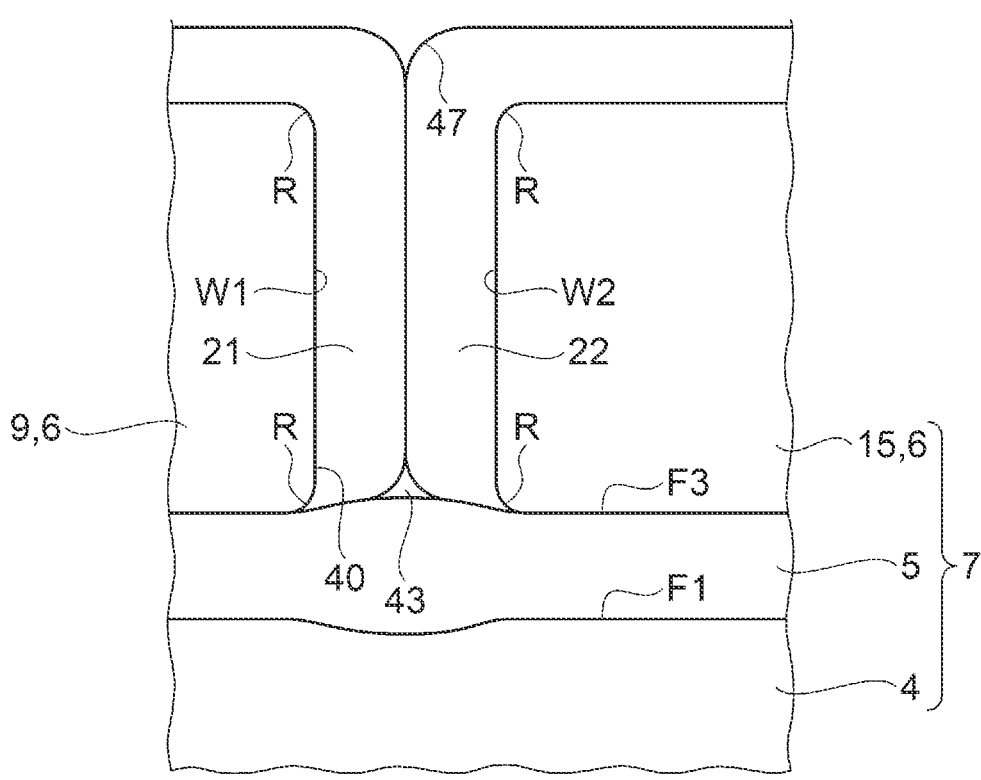
FIG. 6 is a cross-sectional view of a form of the insulating separation portion in the manufacturing process.

In step S12, the trench portion 40 is filled with an oxide. In a preferred example, a wet oxidation treatment is performed. For example, a thermal oxidation treatment is performed at 1100° C. for 10 hours or more using a pyrogenic oxidation method. For example, when an oxide film having a thickness of 1 μm or more is formed from each of the first side surface W1 and the second side surface W2 of the trench portion 40 having a width of 2 μm by the thermal oxidation treatment, the oxide films formed from both sides are physically brought into contact with each other to fill the trench portion 40. Accordingly, as shown in FIG. 6, the trench portion 40 is filled with the first oxide film 21 and the second oxide film 22. At this time, the first oxide film 21 and the second oxide film 22 are formed on the upper surface of the semiconductor layer 6 to have a thickness substantially the same as that on the first side surface W1 and that on the second side surface W2.

A recess 47 is formed in a bonding portion between the first oxide film 21 and the second oxide film 22 in an upper portion of the trench portion 40. For example, when the trench portion 40 having the width of 2 μm was oxidized by a pyrogenic oxidation method at 1100° C. for 18.5 hours, a recess having an opening width of 0.6 μm and a depth of 1.29 μm was formed. At this time, the gap 43, the thick portion of the insulating film 5, and the corners R were also formed by the thermal oxidation treatment. In a preferred example, the thermal oxidation treatment is performed without removing the hard mask 48 remaining at the time of forming the trench portion 40. Accordingly, it is determined that a recess with a shape in which an opening width is widened and the recess is easy to be filled is obtained. For example, while the hard mask 48 having a thickness of about 0.88 μm was left, when the thermal oxidation treatment was performed on the trench portion 40 having the width of 2 μm under the same oxidation condition, a recess having an opening width of 2.33 μm and a depth of 2.23 μm was formed. By using the above steps, the outer frame portion 9 and the fixed electrode support portion 15 are oxidized to form the first oxide film 21 and the second oxide film 22, and the first oxide film 21 and the second oxide film 22 are brought into physical contact with each other, thereby filling the trench portion 40.

Figure 7:
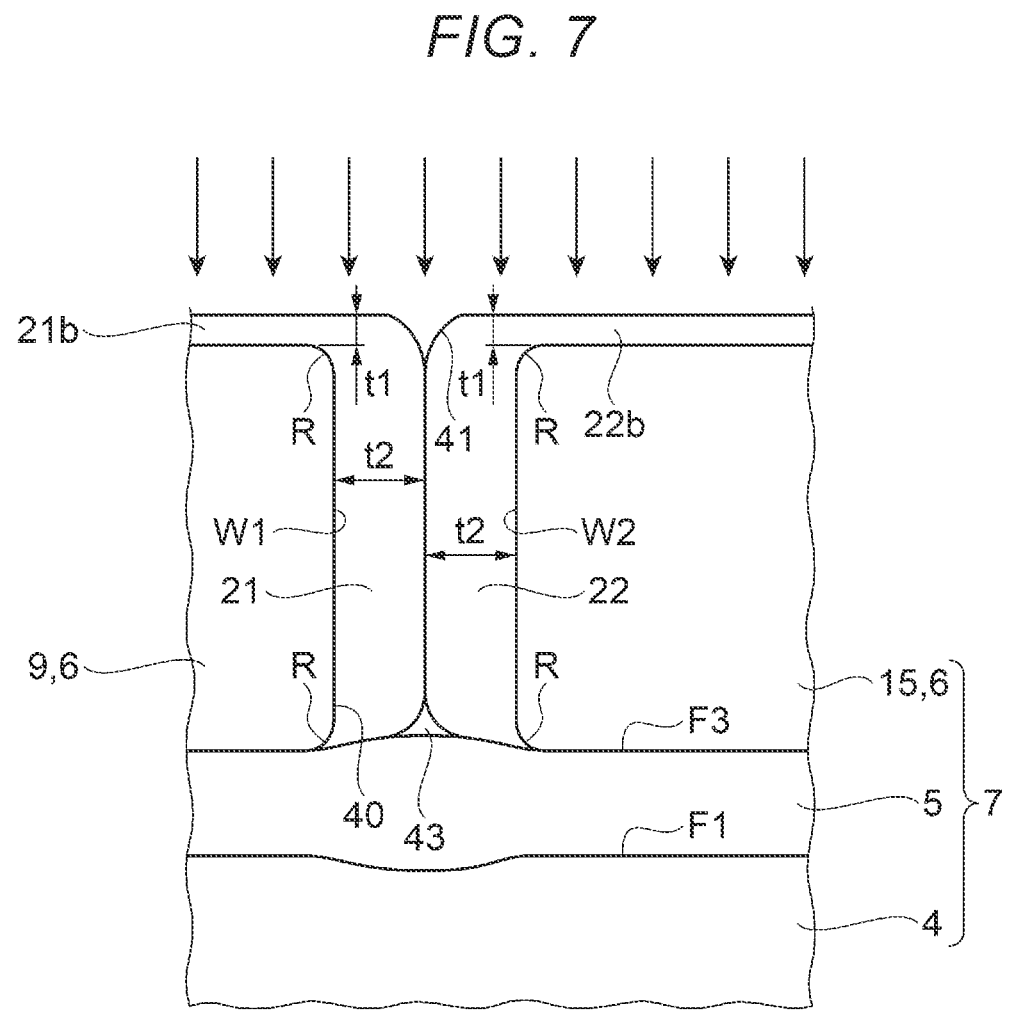

In step S13, the first oxide film 21 and the second oxide film 22 formed on the upper surfaces of the trench portion 40 and the semiconductor layer 6 are etched back. In a preferred example, the first oxide film 21 and the second oxide film 22 are dry-etched. At this time, since wet etching is isotropic etching, the recess 47 (FIG. 6) may be opened wide. By dry etching, etching back can be performed while maintaining the opening width. By the etching back, the first oxide film 21 and the second oxide film 22 are thinned, and accordingly, a position of the recess 47 (FIG. 6) is lowered and the recess 41 is formed (FIG. 7). Accordingly, as shown in FIG. 7, the thinned first oxide film 21b and second oxide film 22b are formed on the upper surface of the semiconductor layer 6.

In the embodiment, as a preferred example, when the thicknesses of the first oxide film 21 and the second oxide film 22 on the first side surface W1 and the second side surface W2 are each defined as the side surface thickness t2 of the thermal oxide film, and the thicknesses of the first oxide film 21b and the second oxide film 22b after etching back are each defined as the upper surface thickness t1 of the thermal oxide film, the following formula (1) is satisfied. If the thermal oxide film is not etched back, the first oxide film 21 and the second oxide film 22 are too thick, and contact failure may occur in the contact portion 26 to be described later. On the other hand, if the semiconductor layer 6 is exposed due to excessive etching back, a step is formed, and irregularities may remain in the future.

$$0 < \text{upper surface thickness } t1 \text{ of thermal oxide film} < \text{side surface thickness } t2 \text{ of thermal oxide film} \quad (1)$$

Figure 8:
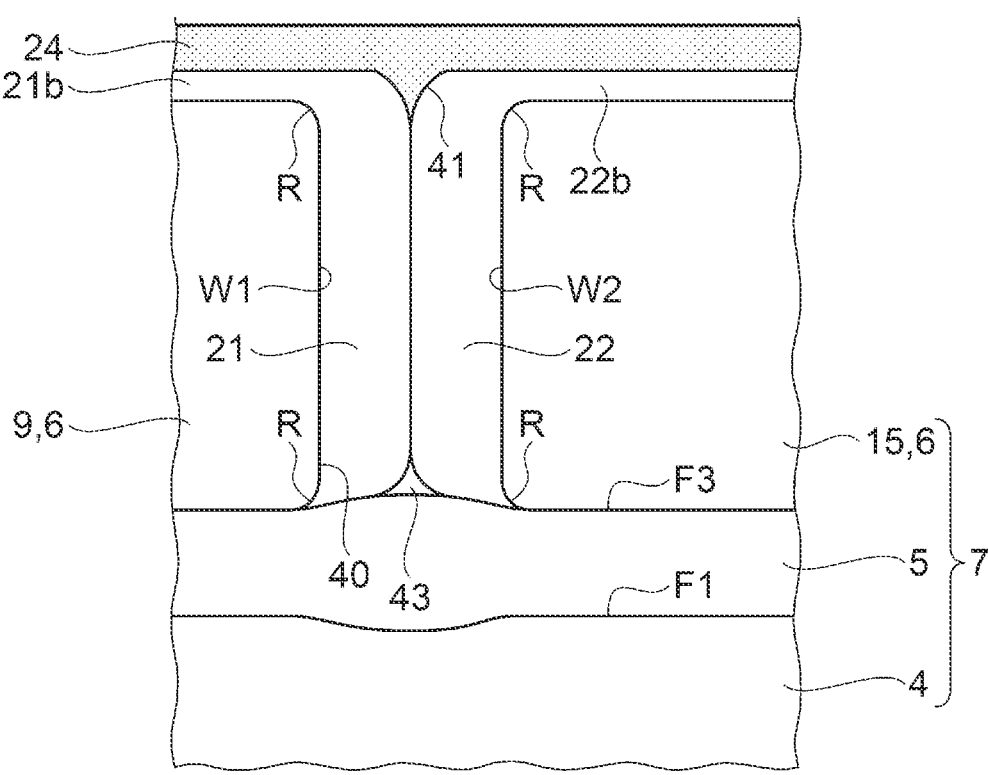
FIG. 8 is a cross-sectional view of a form of the insulating separation portion in the manufacturing process.

In step S14, the planarization insulating film 24 is formed on the first oxide film 21b and the second oxide film 22b. Specifically, a SOG solution containing an alkylsilsesquioxane polymer as a main component is applied by a spin coating method, and is cured by a heat treatment. A heating temperature is preferably 300° C. or higher and 500° C. or lower, and more preferably 300° C. or higher and 450° C. or lower. In a preferred example, a coating treatment and a baking treatment are performed a plurality of times. Accordingly, as shown in FIG. 8, a space between the first oxide film 21b and the second oxide film 22b can be filled. For example, even if the recess 41 has curved lines and the interval therebetween gradually narrows to the region in physical contact, the recess 41 can be reliably filled. Even if the recess 41 has a depth of a V-groove, a seam, a notch, or the like, the planarization insulating film 24 can fill the recess 41. That is, the planarization insulating film 24 is uniformly present at the boundary portion between the first oxide film 21 and the second oxide film 22, and no gap is present. In addition, the upper surface of the planarization insulating film 24 can be planarized while reliably filling the recess 41 at the thermal oxide film boundary. A relative dielectric constant of the planarization insulating film 24 is from 2.9 to 3.4, and may be 3.9 or less. If a SOG material having a dielectric constant of 2.0 or less is used, a mechanical strength of the planarization insulating film 24 may be reduced. In addition, in an organic SOG material having a methyl group, since degassing may affect device performance, it is necessary to use the SOG material according to the application.

In step S15, the wiring 29 is formed on the planarization insulating film 24. First, before the wiring 29 is formed, the contact portion 26 (FIG. 3) is formed. Then, a wiring layer is formed on the planarization insulating film 24 and the contact portion 26 using, for example, a CVD method or a vapor deposition method, and the wiring layer is patterned to form the wiring 29 shown in FIG. 3 (FIG. 1). When the wiring 29 is formed, other wirings (not shown), the electrode pads 27 and 28 (FIG. 1), and the like are also formed together.

In step S16, outer shapes of the movable portion 2 (FIG. 1), the fixed electrode portions 3, the outer frame portion 9, and the like are formed. As described above, the movable portion 2, the fixed electrode portions 3, the outer frame portion 9, and the like are formed at the semiconductor layer 6. In the embodiment, an unnecessary portion of the semiconductor layer 6 is removed by using a dry etching method or the like according to the outer shapes of portions such as the movable portion 2, the fixed electrode portions 3, and the outer frame portion 9. In certain cases, the unnecessary insulating film 5 may be removed. Accordingly, the acceleration sensor 1 shown in FIG. 1 is formed.

As described above, according to the acceleration sensor 1 and the method of manufacturing the acceleration sensor 1 according to the embodiment, the following effects can be obtained.

The acceleration sensor 1 as an inertial sensor includes the substrate 4, the insulating film 5 provided on the first surface F1 which is a main surface of the substrate 4, the outer frame portion 9 as the first semiconductor layer and the fixed electrode support portion 15 as the second semiconductor layer which are provided on an opposite-side surface of the insulating film 5 from the substrate 4, the first oxide film 21 provided on the first side surface W1 of the outer frame portion 9 on a fixed electrode support portion 15 side, the second oxide film 22 provided on the second side surface W2 of the fixed electrode support portion 15 on an outer frame portion 9 side, the planarization insulating film 24 provided above the first oxide film 21 and the second oxide film 22 and between the first oxide film 21 and the second oxide film 22, and the wiring 29 provided on the planarization insulating film 24 and electrically coupled to the fixed electrode support portion 15.

Accordingly, the space between the first semiconductor layer and the second semiconductor layer is filled with the first oxide film 21 and the second oxide film 22 which are thermal oxide films. Accordingly, unlike the inertial sensor in the related art in which the parasitic capacitance between the semiconductors increases and deterioration in the bias characteristics or the like occurs due to the insertion of the conductive material between the semiconductors separated by the trench, the parasitic capacitance such as the fringe capacitance between the first semiconductor layer and the second semiconductor layer can be reduced, and thus the acceleration sensor 1 having good bias characteristics can be provided.

Further, since the recess 41 formed in the boundary portion between the upper surface of the first oxide film 21 and the upper surface of the second oxide film 22 is filled with the planarization insulating film 24 and the upper surface of the planarization insulating film 24 is planarized, there is no concern that a failure such as a crack occurs even when the wiring 29 is formed in the upper layer.

Therefore, the acceleration sensor 1 having high reliability can be provided.

When the thicknesses of the first oxide film 21 and the second oxide film 22 on the first side surface W1 and the second side surface W2 are each defined as the side surface thickness t2 of the thermal oxide film, and the thicknesses of the first oxide film 21b and the second oxide film 22b after etching back are each defined as the upper surface thickness t1 of the thermal oxide film, the formula (1) is satisfied.

If the thermal oxide film is not etched back, the first oxide film 21 and the second oxide film 22 are too thick, and contact failure may occur in the contact portion 26. On the other hand, if the semiconductor layer 6 is exposed due to excessive etching back, a step is formed, and irregularities may remain in the future. Accordingly, since the thickness t1 of the first oxide film 21b and the second oxide film 22b can be optimized, the reliability of the wiring 29 formed in the upper layer can be ensured.

The relative dielectric constant of the planarization insulating film 24 is 3.9 or less.

Accordingly, since the planarization insulating film 24 has a required strength and planarization performance, the planarization insulating film 24 is excellent in reliability.

The first semiconductor layer and the second semiconductor layer are made of single-crystal silicon, and the first oxide film 21 and the second oxide film 22 are made of thermal silicon oxide.

The thermal silicon oxide is, for example, an insulator having higher quality and higher breakdown voltage than silicon oxide obtained by the CVD method. Accordingly, since insulation characteristics can be improved, the reliability of the insulating separation portion 20 can be improved.

The gap 43 surrounded by the insulating film 5, the first oxide film 21, and the second oxide film 22 is formed. Accordingly, the fringe capacitance can be reduced by the presence of the gap 43 having a relative dielectric constant of 1. Accordingly, the parasitic capacitance between the first semiconductor layer and the second semiconductor layer is reduced, so that the acceleration sensor 1 having good bias characteristics can be provided.

A method of manufacturing the acceleration sensor 1 includes: preparing the base body 7 including the substrate 4, the insulating film 5 provided on the first surface F1 which is a main surface of the substrate 4, and the semiconductor layer 6 formed on an opposite-side surface of the insulating film 5 from the substrate 4; removing a part of the semiconductor layer 6 to form the trench portion 40, and the outer frame portion 9 as the first semiconductor layer and the fixed electrode support portion 15 as the second semiconductor layer, the outer frame portion 9 and the fixed electrode support portion 15 facing each other with the trench portion 40 interposed therebetween; thermally oxidizing the outer frame portion 9 and the fixed electrode support portion 15 to form the first oxide film 21 and the second oxide film 22, and filling the trench portion 40 by physically bringing the first oxide film 21 and the second oxide film 22 into contact; forming the planarization insulating film 24 on the first oxide film 21 and the second oxide film 22 by a coating method; and forming the wiring 29 on the planarization insulating film 24.

According to this method, the space between the first semiconductor layer and the second semiconductor layer can be filled with the first oxide film 21 and the second oxide film 22 which are thermal oxide films by thermal oxidation. Accordingly, unlike the inertial sensor in the related art in which the parasitic capacitance between the semiconductors increases and deterioration in the bias characteristics or the like occurs due to the insertion of the conductive material between the semiconductors separated by the trench, the parasitic capacitance such as the fringe capacitance between the first semiconductor layer and the second semiconductor layer can be reduced, and thus the acceleration sensor 1 having good bias characteristics can be provided.

Further, by the coating method using the SOG material, the planarization insulating film 24 can fill the recess 41 generated in the boundary portion between the upper surfaces of the first oxide film 21 and the second oxide film 22. Further, since the upper surface of the planarization insulating film 24 is planarized, there is no concern that a failure such as a crack occurs even when the wiring 29 is formed in the upper layer.

Accordingly, it is possible to provide a manufacturing method capable of manufacturing the acceleration sensor 1 having high reliability.

The method of manufacturing the acceleration sensor 1 further includes a step of etching back the first oxide film and the second oxide film formed on the upper surfaces of the first semiconductor layer and the second semiconductor layer after the step of filling the trench portion 40.

Accordingly, since the thickness t1 of the first oxide film 21b and the second oxide film 22b can be optimized, the reliability of the wiring 29 formed in the upper layer can be ensured.

The planarization insulating film 24 is formed by applying the SOG material and then performing the heat treatment, and the temperature of the heat treatment is 300° C. or higher and 500° C. or lower.

Accordingly, it is possible to reliably fill the recess 41 at the thermal oxide film boundary and to planarize the upper surface of the planarization insulating film 24. Therefore, the reliability of the wiring 29 formed in the upper layer can be ensured.

Second Embodiment

Different Configuration of Insulating Separation Portion

Figure 9:
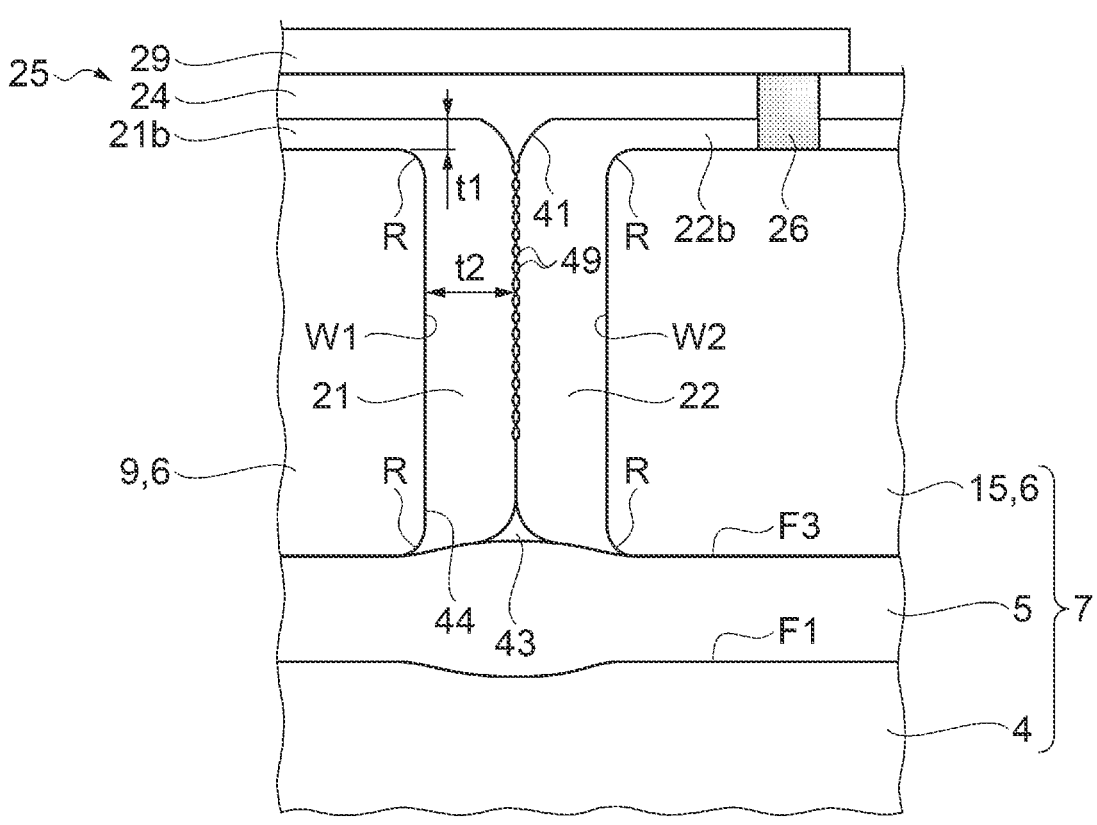
FIG. 9 is a cross-sectional view of an insulating separation portion according to a second embodiment.

FIG. 9 is a cross-sectional view of an insulating separation portion according to a second embodiment, and corresponds to FIG. 3.

Although the trench portion 40 is formed by using the DRIE method in the above embodiment, the present disclosure is not limited to this method. Any method may be used as long as the method can be used to form a trench portion dividing the semiconductor layer into the first semiconductor layer and the second semiconductor layer with the insulating film 5 as a bottom.

For example, in the embodiment, a trench portion 44 is formed using a Bosch process. Hereinafter, the same reference numerals are given to the same portions as those of the above-described embodiment, and redundant description thereof will be omitted.

In an insulating separation portion 25 according to the embodiment shown in FIG. 9, the trench portion 44 is formed by the Bosch process. The Bosch process is a type of DRIE and is a process of alternately performing etching and protective layer deposition. When the semiconductor layer 6 is anisotropically etched by the Bosch process, shell-shaped irregularities called scallops are formed on the first side surface W1 and the second side surface W2 of the trench portion 44. When a thermal oxidation treatment is performed in a state in which the irregularities are formed, the shape is inherited to a thermal oxide film.

Therefore, as shown in FIG. 9, in the insulating separation portion 25, a plurality of scallops 49 are formed at the boundary portion between the first oxide film 21 and the second oxide film 22. The configuration is the same as that in FIG. 3 except that the scallops 49 are formed.

Even if the scallops 49 are formed, the recess 41 formed in the boundary portion between the first oxide film 21 and the second oxide film 22 can be filled by coating the SOG solution, and the planarization insulating film 24 having a planarized surface can be formed.

As described above, according to the acceleration sensor 1 and the method of manufacturing the acceleration sensor 1 according to the embodiment, the following effects can be obtained in addition to the effects of the first embodiment.

Even in the insulating separation portion 25 having the scallops 49, the planarization insulating film 24 having the planarized surface can be formed by applying the SOG solution. In addition, as for the insulation performance of the insulating separation portion 25 and the reliability of the wiring 29, performance comparable to that of the insulating separation portion 20 in FIG. 3 can also be ensured. Therefore, the acceleration sensor 1 having high reliability can be provided. In addition, it is possible to provide a manufacturing method capable of manufacturing the acceleration sensor 1 having high reliability.

Third Embodiment

Application of Insulating Separation Portion

Figure 10:
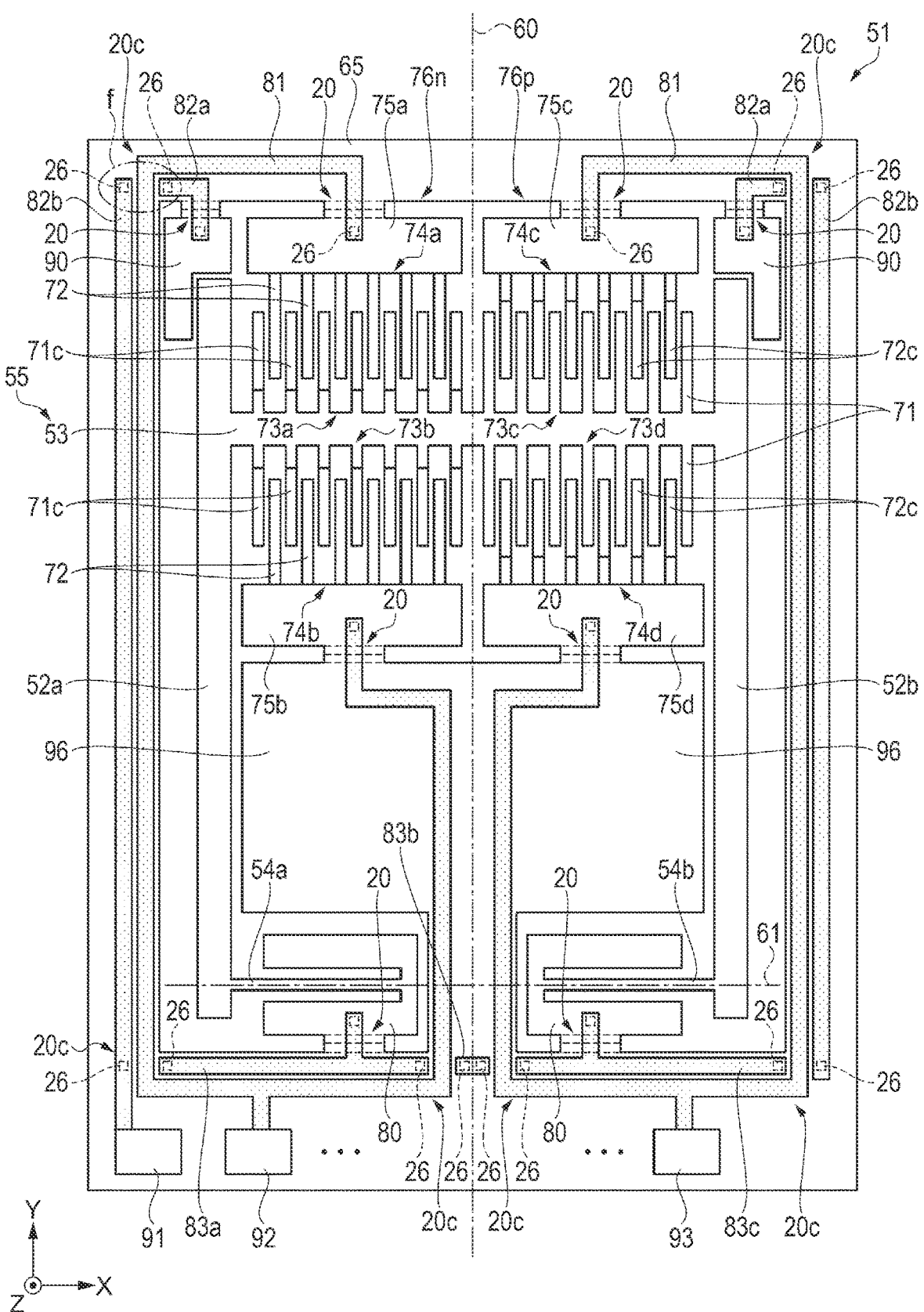
FIG. 10 is a plan view of an acceleration sensor according to a third embodiment.

FIG. 10 is a plan view of an acceleration sensor according to a third embodiment.

In the above embodiments, the case where the insulating separation portions 20 and 25 are used for the purpose of insulating separation of a semiconductor element, ensuring reliability of the wiring, and the like is described, and the use is not limited thereto. For example, the insulating separation portion may be used for three-dimensional intersection of wiring.

Outline of Acceleration Sensor

An acceleration sensor 51 in the embodiment shown in FIG. 10 is an acceleration sensor that detects an acceleration in a Z-axis direction, and employs a so-called one-side seesaw structure in which a movable body 55 swings about a swing shaft 61.

The acceleration sensor 51 includes fixed portions the movable body 55 that can swing around the swing shaft 61 that passes through the center of the fixed portions 80 along the X axis, a first rotary spring 54a and a second rotary spring 54b that couple the fixed portions and the movable body 55, and the like. The fixed portion is fixed to a pedestal portion protruding from a base body (not shown). A periphery of the pedestal portion is a cavity, and the movable body 55 is configured to be swingable.

The movable body 55 includes a first bar 52a extending from the first rotary spring 54a in the Y plus direction, a second bar 52b extending from the second rotary spring 54b in the Y plus direction, and a third bar 53 coupling the first bar 52a and the second bar 52b.

The third bar 53 is provided with four movable electrode groups 73a to 73d having a comb tooth shape.

The movable electrode group 73a includes seven movable electrodes 71c extending in the Y plus direction from the third bar 53 on an X minus side of a center line 60. The movable electrode group 73b includes seven movable electrodes 71c extending in the Y minus direction from the third bar 53 on the X minus side of the center line 60. The number of the movable electrodes 71c is not limited to seven, and may be plural.

The movable electrode groups 73c and 73d are provided at positions symmetrical to the movable electrode groups 73a and 73b on an X plus side with respect to the center line 60 as an axis of symmetry.

Then, the base body is provided with fixed electrode groups 74a to 74d facing the movable electrode groups 73a to 73d.

The fixed electrode group 74a includes a support portion 75a fixed to a base and six fixed electrodes 72 extending in the Y minus direction from the support portion 75a. The fixed electrode group 74b includes a support portion 75b fixed to the base and six fixed electrodes 72 extending in the Y plus direction from the support portion 75b. The number is not limited to six, and may be any number corresponding to the number of the movable electrodes 71c.

The fixed electrode groups 74c and 74d are provided at positions symmetrical to the fixed electrode groups 74a and 74b on the X plus side with respect to the center line 60 as an axis of symmetry.

A detection unit including the fixed electrode group 74a and the movable electrode group 73a and a detection unit including the fixed electrode group 74b and the movable electrode group 73b are collectively referred to as an N-type detection unit 76n. In the N-type detection unit 76n, parallel plate type capacitance is formed by the fixed electrodes 72 and the movable electrodes 71c disposed to face each other. The capacitance changes according to a change in an overlapping area between the fixed electrodes 72 and the movable electrodes 71c along with a displacement in the movable electrodes 71c caused by the acceleration.

Similarly, a detection unit including the fixed electrode group 74c and the movable electrode group 73c and a detection unit including the fixed electrode group 74d and the movable electrode group 73d are collectively referred to as a P-type detection unit 76p. In the P-type detection unit 76p, parallel plate type capacitance is formed by fixed electrodes 72c and the movable electrodes 71 disposed to face each other. The capacitance changes according to a change in an overlapping area between the fixed electrodes 72c and the movable electrodes 71 along with a displacement in the movable electrodes 71 caused by the acceleration.

The movable electrodes 71c of the N-type detection unit 76n are thinner than the movable electrodes 71 of the P-type detection unit 76p in the Z direction. Specifically, the movable electrodes 71c each have the same thickness as that of the third bar 53 at the base, and are cut in a stepwise manner in the middle of an extending direction so as to be thinned. Accordingly, the thickness of the seven movable electrodes 71c on a Z plus side is reduced in a portion facing the fixed electrodes 72.

The fixed electrodes 72c of the P-type detection unit 76p are thinner than the fixed electrodes 72 of the N-type detection unit 76n in the Z direction. Specifically, the fixed electrodes 72c each have the same thickness as that at the base on support portions 75c and 75d side, and are cut in a stepwise manner in the middle of the extending direction so as to be thinned. Accordingly, the thickness of the six fixed electrodes 72c on the Z plus side is reduced in a portion facing the movable electrodes 71.

According to such a configuration, when the acceleration is generated in the Z plus direction, the overlapping area in the N-type detection unit 76n is reduced, and the overlapping area in the P-type detection unit 76p is maintained. When an acceleration in a Z minus direction is generated, the overlapping area in the N-type detection unit 76n is maintained, and the overlapping area in the P-type detection unit 76p is reduced.

Based on such a correlation, in the acceleration sensor 51, the acceleration in the Z plus/minus direction can be detected by detecting a change in the overlapping area in the N-type detection unit 76n and the P-type detection unit 76p as a change in static capacitance.

Application of Insulating Separation Portion to Wiring

Here, a three-dimensional intersection example of wiring to which the insulating separation portion 20 is applied will be described. Although many other wirings are actually provided, the wirings applied to the insulating separation portion 20 will be selectively described.

As described above, since the fixed electrode group 74a and the fixed electrode group 74b in the N-type detection unit 76n are paired, the two groups are electrically coupled to each other by a wiring 81. The wiring 81 extends from the support portion 75a of the fixed electrode group 74a through an outer frame 65 in a large crank shape, extends in the Y plus direction along the center line 60, and is coupled to the support portion 75b of the fixed electrode group 74b. The wiring 81 is branched in the middle and coupled to an electrode pad 92. A detection voltage of the N-type detection unit 76n is output from the electrode pad 92.

Here, the insulating separation portion 20 is provided between the support portion 75a and the outer frame and the wiring 81 is formed on the insulating separation portion 20. Similarly, the insulating separation portion is provided between the support portion 75b and a semiconductor portion 96, and the wiring 81 is formed on the insulating separation portion 20. The semiconductor portion 96 is coupled to the outer frame 65 at a portion along the center line 60. Therefore, the insulating separation portion 20 is used in each unit of the acceleration sensor 51.

A semiconductor portion 90 is provided in an X minus direction of the support portion 75a. The semiconductor portion 90 is, for example, a stopper portion, and is a portion that limits in-plane displacement of the movable body 55. A potential the same as that of the movable body 55 is applied to the semiconductor portion 90 from a wiring 82a.

The wiring 82a passes from the semiconductor portion 90 through the outer frame 65 and is coupled to a wiring 82b across the wiring 81, and the wiring 82b is coupled to an electrode pad 91. The insulating separation portion 20 is provided between the semiconductor portion 90 and the outer frame 65, and the wiring 82a is formed on the insulating separation portion 20.

Figure 11:
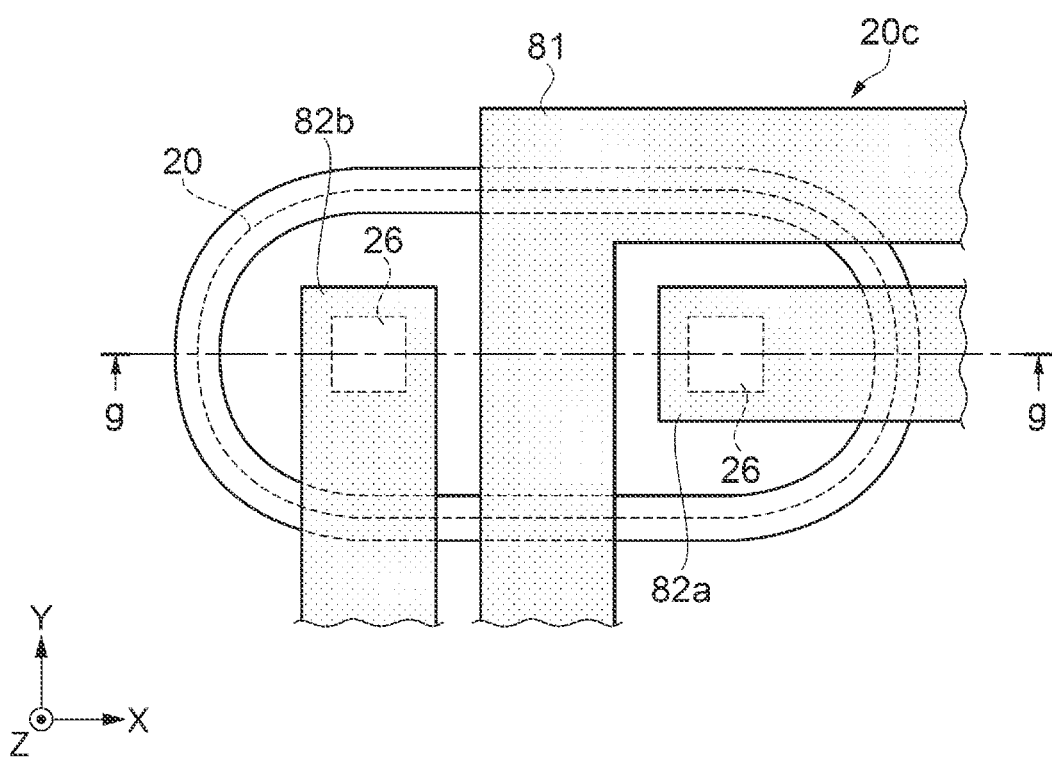
FIG. 11 is an enlarged cross-sectional view of a portion f shown in FIG. 10.
Figure 12:
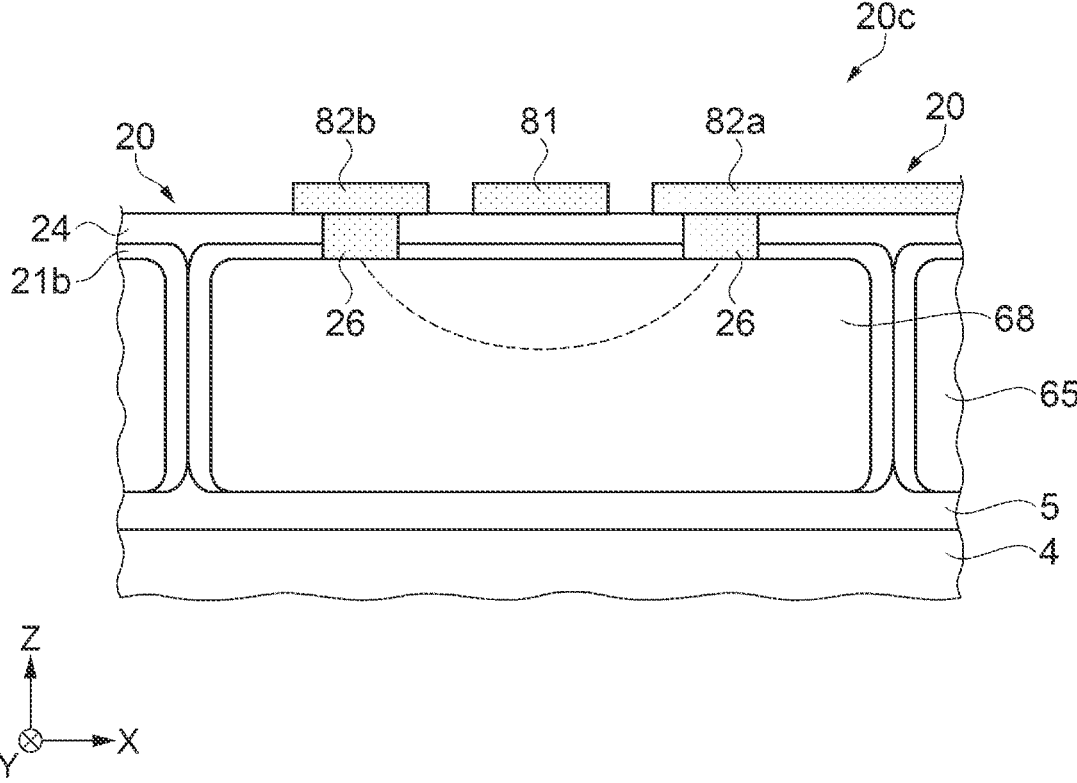
FIG. 12 is a cross-sectional view taken along a line g-g in FIG. 11.

FIG. 11 is an enlarged view of a portion f in FIG. FIG. 12 is a cross-sectional view taken along a line g-g in FIG. 11.

Here, a three-dimensional intersection example using the insulating separation portion 20 in the wiring 81 and the wirings 82*a* and 82*b* will be described.

As shown in FIG. 11, the insulating separation portion 20 according to the embodiment is formed in an oval shape or a closed loop shape. An intersection portion of the wiring 81 and the wirings 82*a* and 82*b* is inside the oval. Accordingly, as shown in FIG. 12, a semiconductor portion 68 partitioned by the insulating separation portion is separated from a semiconductor layer of the surrounding outer frame 65 and is an electrically independent portion. In addition, by forming the insulating separation portion 20 into the closed loop shape, ends of the insulating separation can be reduced and a yield can be improved.

When the two wirings are made to three-dimensionally intersect with each other, the semiconductor portion 68 is used as a wiring. Specifically, as shown in FIG. 12, an electrical conduction path is constituted by the wiring 82*a*, the contact portion 26, the semiconductor portion 68, the contact portion 26, and the wiring 82*b*. Such a three-dimensional intersection configuration is referred to as a three-dimensional intersection portion 20*c*. The three-dimensional intersection portion 20*c* is not limited to being applied to the wiring 81 and the wiring 82, and can be applied to a portion where two wirings having different potentials intersect with each other. Further, as shown in FIG. 11, even when a plurality of wirings pass through an upper portion of the insulating separation portion 20, a crack does not occur in the wirings, and the reliability is excellent. Instead of the insulating separation portion 20, the insulating separation portion 25 may be used to obtain the same effect.

The description returns to FIG. 10.

The acceleration sensor 51 has a substantially symmetrical structure with the center line 60 as the axis of symmetry, and the same parts are denoted by the same reference numerals. The semiconductor portion 90 is also provided on the X plus side (right side) of the center line 60, and a potential the same as that of the semiconductor portion 90 on the X minus side (left side) is applied. The right wiring 82*b* electrically coupled to the semiconductor portion 90 passes through the outer frame 65 and is coupled to a wiring 83*c* through the three-dimensional intersection portion 20*c*. The wiring 83*c* is coupled to a wiring 83*b* through the three-dimensional intersection portion 20*c*. The wiring 83*b* is coupled to a wiring 83*a* through the three-dimensional intersection portion 20*c*. The wiring 83*a* is coupled to the left wiring 82*b* through the three-dimensional intersection portion 20*c*. Therefore, the three-dimensional intersection portion 20*c* is used at a plurality of positions.

Further, the wiring 83*a* is branched in the middle, passes over the insulating separation portion 20, and is also coupled to the fixed portion 80. The fixed portion 80 is coupled to the first bar 52*a* through the first rotary spring 54*a*. In other words, the electrode pad 91 applies a potential to the movable body 55 via the wiring 83*a*. In FIG. 10, the wiring 83*c* is also branched in the middle, passes over the insulating separation portion 20, and is coupled to the fixed portion 80. Electrically, either one of the wirings 83*a* and 83*c* may be coupled to the fixed portion 80.

As described above, according to the acceleration sensor 51 in the embodiment, the following effects can be obtained in addition to the effects of the above embodiments.

Accordingly, the insulating separation portions 20 and 25 can also be applied to the acceleration sensor 51 that detects the acceleration in the Z-axis direction. Further, three-dimensional intersection can be implemented by the insulating separation portion 20 or 25 at a portion where two wirings having different potentials intersect.

Accordingly, it is possible to provide the acceleration sensor 51 having high reliability. Also, it is possible to provide a three-dimensional intersection structure of wirings having high reliability.

Fourth Embodiment

Outline of Inertial Measurement Unit

Figure 13:
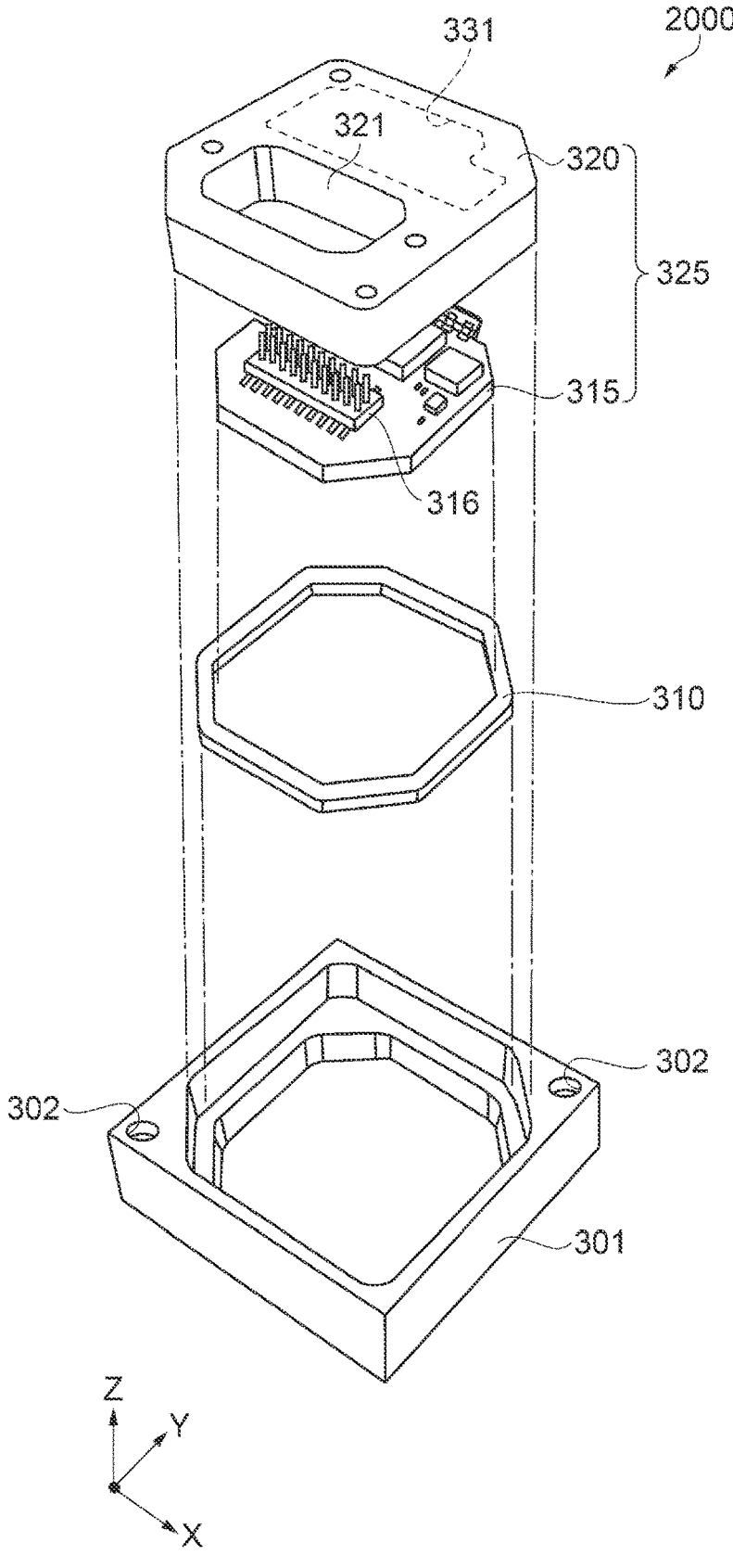
FIG. 13 is an exploded perspective view of an inertial measurement unit according to a fourth embodiment.
Figure 14:
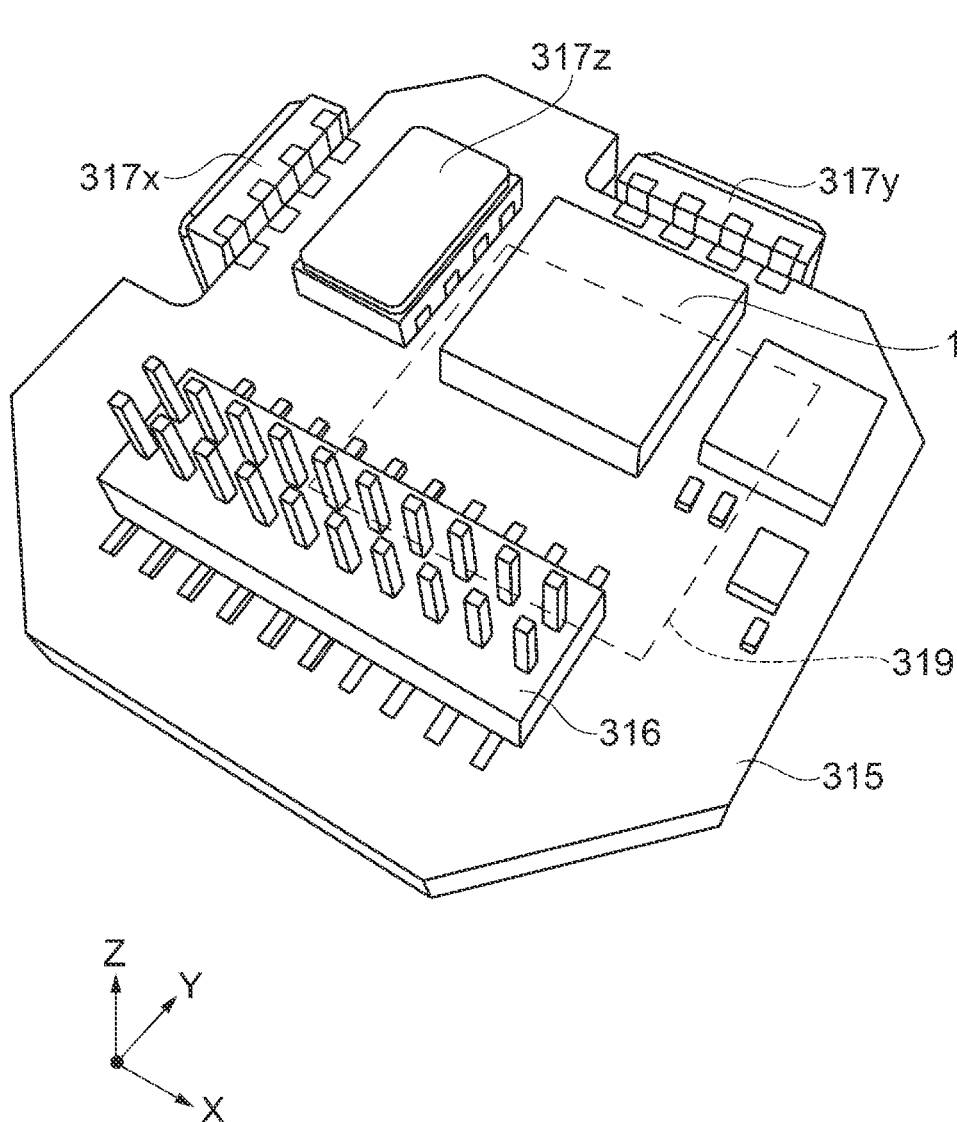
FIG. 14 is a perspective view of a circuit board.

FIG. 13 is an exploded perspective view of an inertial measurement unit. FIG. 14 is a perspective view of a circuit board.

An inertial measurement unit 2000 according to the embodiment is equipped with the acceleration sensor 1 described above.

The inertial measurement unit 2000 is a device that detects an inertial momentum of a posture or a behavior of a moving body such as an automobile or a robot. The inertial measurement unit 2000 includes an inertial sensor such as an acceleration sensor or an angular velocity sensor, and functions as a so-called motion sensor.

As shown in FIG. 13, the inertial measurement unit 2000 is a cuboid having a substantially square planar shape. The inertial measurement unit 2000 includes an outer case 301, a bonding member 310, and a sensor module 325 on which an inertial sensor is mounted.

Similar to the overall shape of the inertial measurement unit 2000, an outer shape of the outer case 301 is a cuboid having a substantially square planar shape. Screw holes 302 are formed in the vicinity of two vertexes positioned in a diagonal direction of the square. Two screws can be passed through the two screw holes 302 to fix the inertial measurement unit 2000 to a mounted surface of a mounted body such as an automobile.

The outer case 301 has a box shape, and the sensor module 325 is stored therein. Specifically, the sensor module 325 is inserted into the outer case 301 with the bonding member 310 interposed therebetween.

The sensor module 325 includes an inner case 320 and a substrate 315.

The inner case 320 is a member that supports the substrate 315, and the substrate 315 is bonded to a lower surface of the inner case 320 via an adhesive.

The inner case 320 is shaped to fit inside the outer case 301. In the inner case 320, a recess 331 for preventing contact with the substrate 315 and an opening 321 for exposing a connector 316, which will be described later are formed. The inner case 320 is bonded to the outer case 301 through the bonding member 310.

Next, the substrate 315 on which the inertial sensor is mounted will be described.

As shown in FIG. 14, the acceleration sensor 1, the connector 316, an angular velocity sensor 317*z* for detecting an angular velocity around the Z axis, and the like are mounted on a surface of the substrate 315 on an inner case 320 side which is an upper surface of the substrate 315. An angular velocity sensor 317*x* that detects an angular velocity around the X axis and an angular velocity sensor 317*y* that detects an angular velocity around the Y axis are mounted on side surfaces of the substrate 315.

The acceleration sensor 1 may be, for example, an acceleration sensor capable of detecting accelerations in two directions including the X direction and the Y direction or an acceleration sensor capable of detecting accelerations in three directions including the X direction, the Y direction, and the Z direction as necessary.

A control IC 319 serving as a control unit is mounted on a surface of the substrate 315 on an outer case 301 side which is a lower surface of the substrate 315. The control IC 319 is a micro controller unit (MCU), includes a storage unit including a nonvolatile memory, an A/D converter, and the like, and controls each unit of the inertial measurement unit 2000. The storage unit stores a program defining an order and contents for detecting an acceleration and an angular velocity, a program for digitizing detection data and incorporating the digitized detection data into packet data, accompanying data, and the like. In addition, a plurality of electronic components are mounted on the substrate 315.

According to such an inertial measurement unit 2000, since the acceleration sensor 1 as an example of the above-described inertial sensor is used, it is possible to provide the inertial measurement unit 2000 that enjoys the effects related to the acceleration sensor 1.

What is claimed is:

1. An inertial sensor comprising:

a substrate;

an insulating film provided on a main surface of the substrate;

a first semiconductor layer and a second semiconductor layer which are provided on an opposite-side surface of the insulating film from the substrate;

a first oxide film provided on a first side surface of the first semiconductor layer on a second semiconductor layer side;

a second oxide film provided on a second side surface of the second semiconductor layer on a first semiconductor layer side;

a planarization insulating film provided above the first oxide film and the second oxide film and between the first oxide film and the second oxide film; and a wiring provided on the planarization insulating film and electrically coupled to the second semiconductor layer, wherein a trench portion is formed between the first semiconductor layer and the second semiconductor layer, and the trench portion is filled with a first sidewall oxide film formed on a first side surface of the first semiconductor layer facing the second semiconductor layer, and a second sidewall oxide film formed on a second side surface of the second semiconductor layer facing the first semiconductor layer, the insulating film includes a thick film portion in which the film thickness of a region of the insulating film in contact with the trench portion is greater than a first film thickness of a first region of the insulating film in contact with the first semiconductor layer and a second film thickness of a second region of the insulating film in contact with the second semiconductor layer.

2. The inertial sensor according to claim 1, wherein $0 <$ upper surface thickness $t1$ of thermal oxide film $<$ side surface thickness $t2$ of thermal oxide film, in which the side surface thickness $t2$ of the thermal oxide film is a thickness of the first oxide film on the first side surface and a thickness of the second oxide film on the second side surface, and the upper surface thickness $t1$ of the thermal oxide film is a thickness of an upper portion of the first oxide film and a thickness of an upper portion of the second oxide film.

3. The inertial sensor according to claim 1, wherein a relative dielectric constant of the planarization insulating film is 3.9 or less.

4. The inertial sensor according to claim 1, wherein the first semiconductor layer and the second semiconductor layer are made of single-crystal silicon, and the first oxide film and the second oxide film are made of thermal silicon oxide.

5. The inertial sensor according to claim 1, wherein a gap surrounded by the insulating film, the first oxide film, and the second oxide film is formed.

6. An inertial measurement unit comprising:

the inertial sensor according to claim 1; and a control unit configured to control the inertial sensor.

* * * * *